(12) United States Patent
Chen et al.

(10) Patent No.: US 10,499,501 B2
(45) Date of Patent: Dec. 3, 2019

(54) COVER WINDOW

(71) Applicants: Interface Technology (ChengDu) Co., Ltd., Chengdu, Sichuan (CN); Interface Optoelectronics (ShenZhen) Co., Ltd., Shenzhen (CN); General Interface Solution Limited, Miaoli County (TW)

(72) Inventors: Chun-Jen Chen, Miaoli County (TW); Nan-Tsun Kuo, Miaoli County (TW); Chia-Ming Hsieh, Miaoli County (TW); Tzu-Hsiang Lin, Miaoli County (TW)

(73) Assignees: INTERFACE TECHNOLOGY (CHENGDU) CO., LTD., Chengdu, Sichuan (CN); INTERFACE OPTOELECTRONICS (SHENZHEN) CO., LTD., Shenzhen (CN); GENERAL INTERFACE SOLUTION LIMITED, Miaoli County (TW)

( * ) Notice: Subject to any disclaimer, the term of this patent is extended or adjusted under 35 U.S.C. 154(b) by 166 days.

(21) Appl. No.: 15/598,786

(22) Filed: May 18, 2017

(65) Prior Publication Data
US 2018/0143740 A1 May 24, 2018

(30) Foreign Application Priority Data
Nov. 23, 2016 (CN) .......................... 2016 1 1051080

(51) Int. Cl.
*H05K 1/03* (2006.01)
*H05K 1/02* (2006.01)
(Continued)

(52) U.S. Cl.
CPC ......... *H05K 1/0353* (2013.01); *H05K 1/0274* (2013.01); *B32B 27/06* (2013.01);
(Continued)

(58) Field of Classification Search
None
See application file for complete search history.

(56) References Cited

U.S. PATENT DOCUMENTS

2003/0218709 A1* 11/2003 Ito .................. G02B 5/3083
349/117
2005/0213012 A1* 9/2005 Yano ................. G02F 1/13363
349/141
(Continued)

OTHER PUBLICATIONS

"ASTM D 882-02—Standard Test Method for Tensile Properties of Thin Plastic Sheeting." (2002) (Year: 2002).*

*Primary Examiner* — Vivian Chen
(74) *Attorney, Agent, or Firm* — Locke Lord LLP; Tim Tingkang Xia, Esq.

(57) ABSTRACT

A cover window is provided and includes a substrate and a coating layer. The substrate has a thickness of 60 to 120 μm. The substrate has a Re of 6000 to 12000. The coating layer is coated on the substrate. The cover window has a first direction and a second direction. The first direction is a machine direction of the cover window. The second direction is perpendicular to the first direction. A tensile stress of 50 to 130 MPa is exerted in the first direction. A tensile stress of 140 to 300 MPa is exerted in the second direction. Since the substrate has a Re of 6000 to 12000, a penetrating ray of an incident ray is uniformly distributed on a visible region of the cover window, so as to reduce the phase difference between reflected rays, reduce rainbow patterns, and enhance visibility under a polarizer.

11 Claims, 5 Drawing Sheets

(51) Int. Cl.
*G06F 3/0481* (2013.01)
*B32B 27/28* (2006.01)
*B32B 27/36* (2006.01)
*B32B 27/06* (2006.01)

(52) U.S. Cl.
CPC ............ *B32B 27/28* (2013.01); *B32B 27/281* (2013.01); *B32B 27/36* (2013.01); *B32B 2255/00* (2013.01); *B32B 2255/10* (2013.01); *B32B 2307/40* (2013.01); *B32B 2307/50* (2013.01); *B32B 2307/536* (2013.01); *B32B 2367/00* (2013.01); *B32B 2457/20* (2013.01); *B32B 2457/208* (2013.01); *G06F 3/0481* (2013.01); *G06F 2203/04102* (2013.01); *G06F 2203/04103* (2013.01); *H05K 1/03* (2013.01); *H05K 1/036* (2013.01); *H05K 2201/0145* (2013.01); *H05K 2201/0154* (2013.01); *Y10T 428/105* (2015.01); *Y10T 428/1036* (2015.01); *Y10T 428/1164* (2015.01); *Y10T 428/31786* (2015.04)

(56) References Cited

U.S. PATENT DOCUMENTS

| | | | |
|---|---|---|---|
| 2006/0132922 A1* | 6/2006 | Takao | G02B 1/10 359/601 |
| 2006/0134400 A1* | 6/2006 | Takada | C08G 18/672 428/313.9 |
| 2013/0162930 A1* | 6/2013 | Shin | G02B 5/3083 349/62 |
| 2014/0098325 A1* | 4/2014 | Murata | G02F 1/133528 349/69 |
| 2016/0062509 A1* | 3/2016 | Toyoshima | G02F 1/13338 345/174 |
| 2016/0146980 A1* | 5/2016 | Shin | G02F 1/13363 359/489.07 |
| 2016/0150641 A1* | 5/2016 | Yoo | H05K 1/0283 345/174 |
| 2017/0064845 A1* | 3/2017 | Jung | H05K 1/028 |

\* cited by examiner

COVER WINDOW

CROSS-REFERENCE TO RELATED APPLICATION

This application claims priority of application No. 201611051080.9, filed on Nov. 23, 2016 in the State Intellectual Property Office of the P.R.C, the entire content of which is incorporated herein by reference.

FIELD OF THE INVENTION

The present invention relates to cover windows and, more particularly, to a cover window with a substrate whose Re (in-plane retardation) ranges from 6000 to 12000 nm so that a penetrating ray is uniformly distributed on a visible region of the cover window, so as to reduce rainbow patterns and enhance visibility under a polarizer.

BACKGROUND OF THE INVENTION

Conventional cover windows of touch panels are usually made of reinforced glass but lack flexibility and thus are inapplicable to flexible products. In view of this, it is important to develop a cover window which substitutes for conventional glass-based cover windows and has flexibility and satisfactory optical and physical properties, for example, regarding rigidity.

Taiwan patent 1457635 discloses a retardation film which has a uniform Re (in-plane retardation) and is made of monopropylene resin with an isotactic index of above 85%. The retardation film is capable of insignificant zero wavelength dispersion and displays high uniformity of Re (in-plane retardation) values at a specific point, with a mean deviation of ±5 nm. The retardation film capable of insignificant zero wavelength dispersion and the other retardation films capable of negative wavelength dispersion are stacked to manufacture a stacked optical film capable of positive wavelength dispersion.

However, the penetrating ray of Taiwan patent 1457635 is not uniformly distributed on a visible region and thus does not address the aforesaid issues: optical rainbow patterns and visibility under a polarizer.

Referring to FIG. 1, since the coating layer and the substrate do not match in terms of the refractive index, the incident ray ends up with reflected ray 1 and reflected ray 2 which have a phase difference therebetween. The reflected rays 1, 2 which have a phase difference therebetween produce rainbow patterns when observed by users with the naked eye.

Hence, related apparatus manufacturers and researchers look forward to developing a plastic cover window which substitutes for conventional glass cover windows, has flexibility features and surface rigidity, reduces rainbow patterns, and enhances visibility under a polarizer.

SUMMARY OF THE INVENTION

In view of a drawback of the prior art, that is, conventional cover windows of touch panels are usually made of reinforced glass but lack flexibility and thus are inapplicable to flexible products, the inventor of the present invention conducted R&D with a view to overcoming the aforesaid drawback of the prior art. After conducting related tests repeatedly, the inventor of the present invention developed the cover window of the present invention.

It is an objective of the present invention to provide a cover window which features flexibility, reduces rainbow patterns, and enhances visibility under a polarizer.

In order to achieve the above and other objectives, the present invention provides a cover window which comprises a substrate and a coating layer.

The substrate has a thickness of 60 to 120 µm and a Re (in-plane retardation) of 6000 to 12000 nm.

The coating layer is coated on the substrate.

The cover window has a first direction and a second direction. The first direction is a machine direction of the cover window. The second direction is perpendicular to the first direction. A tensile stress of 50 to 130 MPa is exerted in the first direction. A tensile stress of 140 to 300 MPa is exerted in the second direction.

Since the substrate has a Re (in-plane retardation) of 6000 to 12000 nm, a penetrating ray of an incident ray is uniformly distributed on a visible region of the cover window, so as to reduce the phase difference between reflected rays, reduce rainbow patterns, and enhance visibility under a polarizer.

DETAILED DESCRIPTION OF THE EMBODIMENTS

A preferred embodiment of the present invention is illustrated by drawings and described below to enable persons skilled in the art to gain insight into the present invention.

Figure 1:
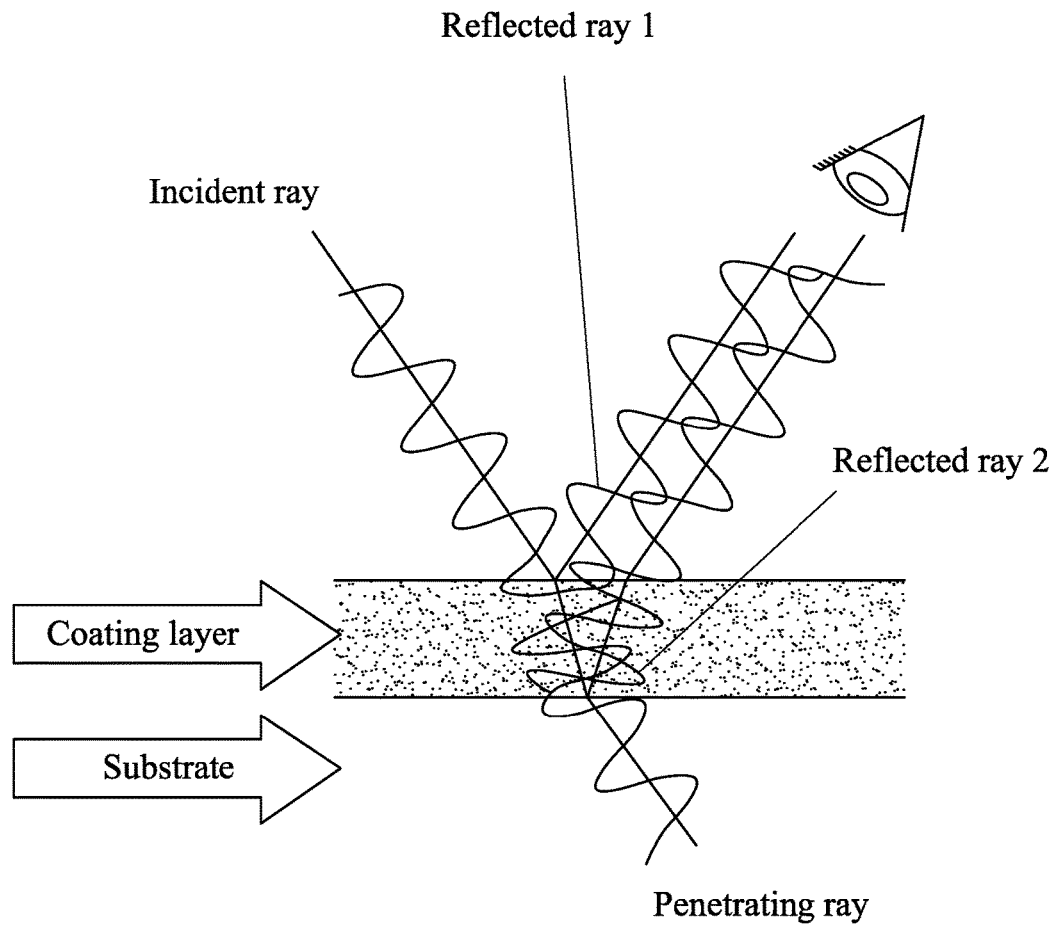
FIG. 1 (PRIOR ART) is a schematic view of a conventional cover window which bears rainbow patterns.
Figure 2:
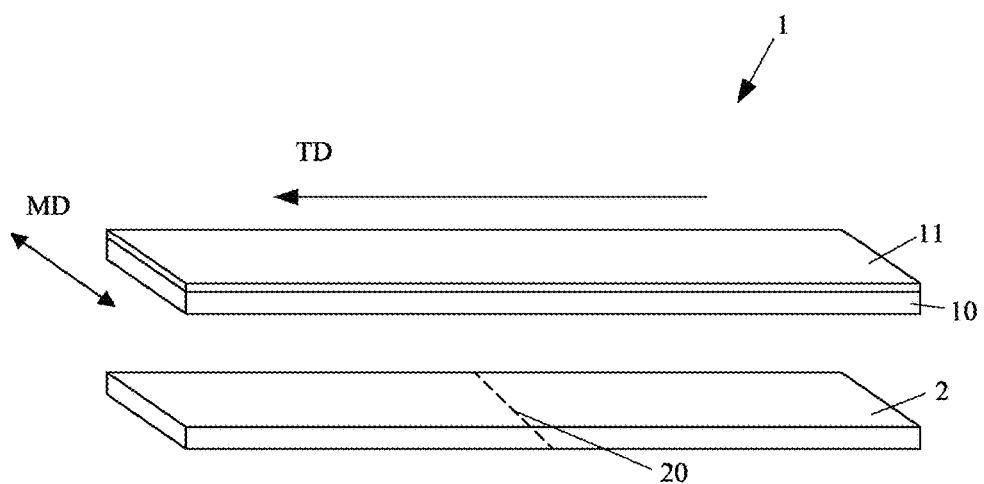
FIG. 2 is a schematic view of a tensile stress exerted in a second direction according to the present invention.

Referring to FIG. 2, a cover window (1) of the present invention comprises a substrate (10) and a coating layer (11).

The cover window (1) of the present invention is applicable to a touch device (2). A flexibility line (20) is centrally defined on the touch device (2).

The substrate (10) has a thickness of 60 to 120 µm. The substrate (10) has a Re (in-plane retardation) of 6000 to 12000 nm.

The coating layer (11) is coated on the substrate (10).

The cover window (1) has a first direction (MD) and a second direction (TD). MD is short for machine direction. TD is short for transverse direction and is perpendicular to the machine direction. The first direction (MD) is a machine direction of the cover window (1). The second direction (TD) is perpendicular to the first direction (MD). A tensile stress of 50 to 130 MPa is exerted in the first direction (MD). A tensile stress of 140 to 300 MPa is exerted in the second direction (TD). Therefore, the cover window (1) reduces rainbow patterns and enhances the visibility under a polarizer.

The substrate (10) has a Re=(nx−ny)×D, wherein nx denotes the maximum refractive index of a film plane (the refractive index along the ground axis and the x-axis), ny denotes the refractive index along the y-axis perpendicular to the ground axis, and D denote the film thickness. Hence, it is feasible to adjust the x-axis to y-axis tensile ratio of a material and change the refractive index along the x-axis and y-axis to thereby increase the difference in the refractive index between the x-axis and y-axis, so as to increase Re.

In a preferred embodiment of the present invention, a tensile stress of 120 MPa is exerted in the first direction (MD).

In a preferred embodiment of the present invention, a tensile stress of 300 MPa is exerted in the second direction (TD).

In a preferred embodiment of the present invention, the substrate (10) is made of polyimide (PI), polyethylene terephthalate (PET), or polyethylene naphthalate (PEN).

In a preferred embodiment of the present invention, the first direction (MD) and the second direction (TD) are perpendicular to each other.

Figure 3:
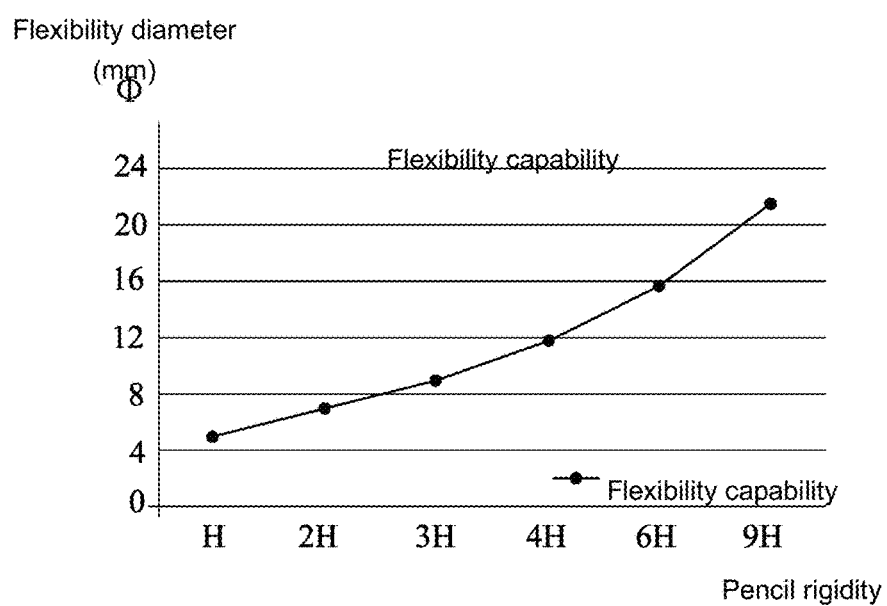
FIG. 3 is a schematic view of relationship between flexibility diameter and rigidity according to the present invention.
Figure 4:
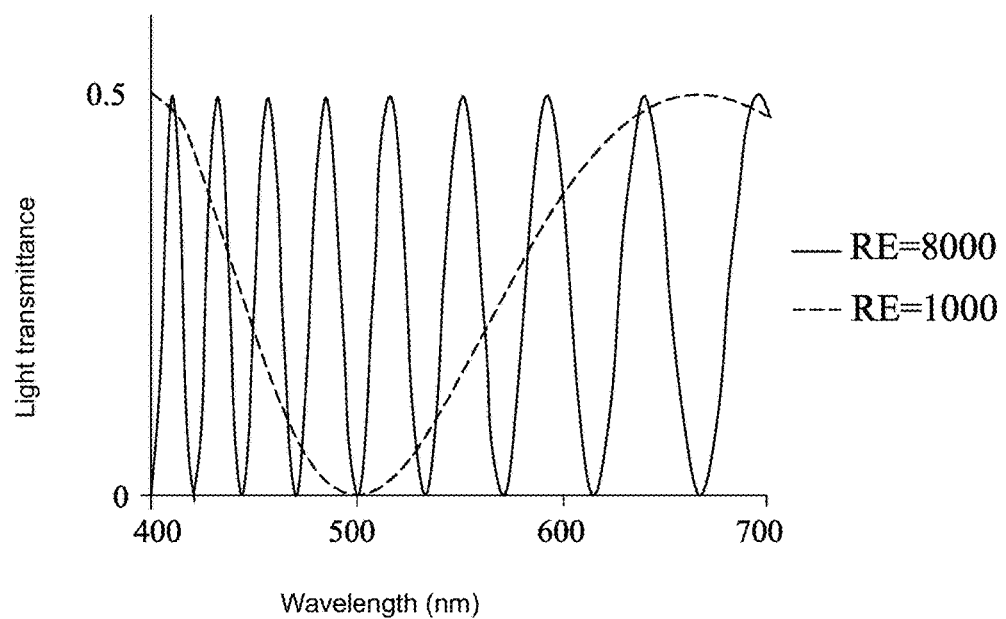
FIG. 4 is a schematic view of relationship between light transmittance and wavelength according to the present invention.

Referring to FIG. 2, FIG. 3 and FIG. 4, flexibility of the cover window (1) and rigidity of the coating layer (11) coated on the same substrate (10) are inversely proportional to each other.

In a preferred embodiment (FIG. 2) of the present invention, the cover window (1) has a flexibility diameter (Φ) of 10 mm, whereas the coating layer (11) has a rigidity of 3 H (equivalent to 750 g under JIS-5600), and thus the cover window (1) strikes a balance between flexibility feature and surface rigidity. Furthermore, the rigidity of the coating layer (11) passes the pencil 3 H rigidity test under JIS, wherein the test pencil 3 H has a load weight of 750 g.

In a preferred embodiment of the present invention, the substrate (10) has a thickness of 80 μm and a Re (in-plane retardation) greater than or equal to 8000 nm so that a penetrating ray is uniformly distributed on the visible region (FIG. 3) to reduce rainbow patterns and enhance visibility under a polarizer.

Figure 5:
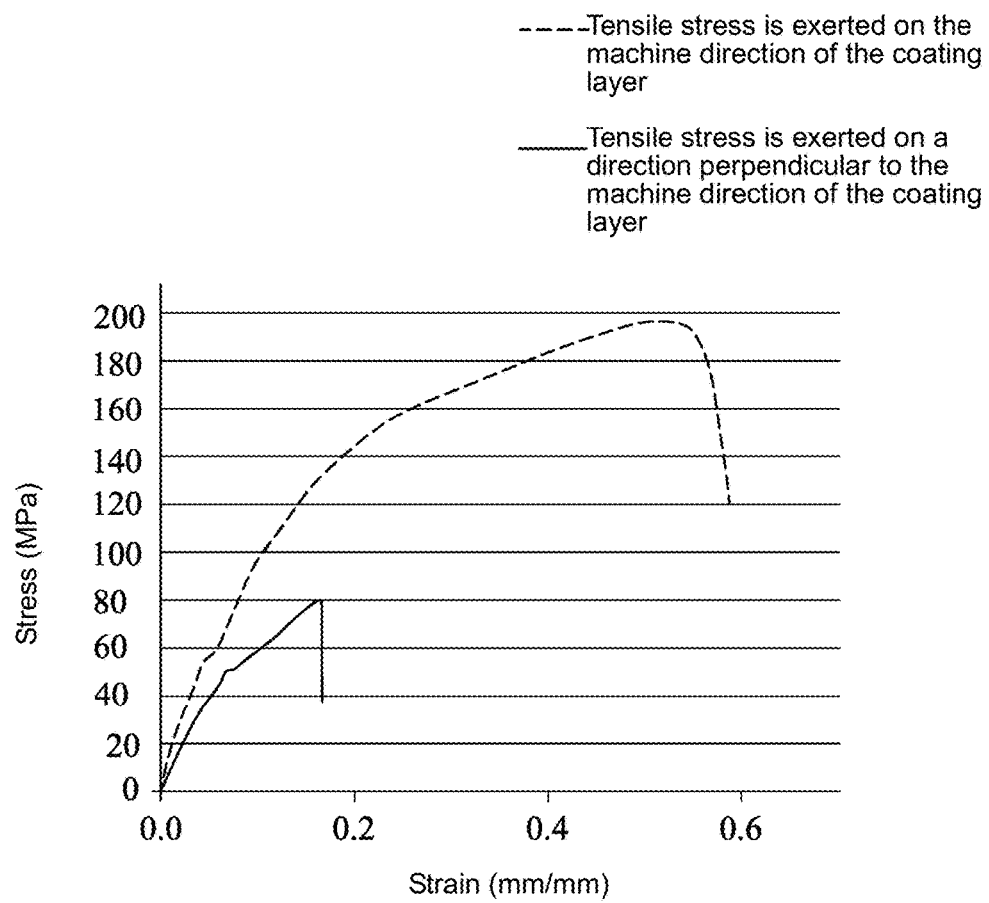
FIG. 5 is a schematic view of relationship between stress and strain according to the present invention.

Referring to FIG. 2 and FIG. 5, the coating layer (11) has a rigidity of 3 H (equivalent to 750 g under JIS-5600), and the cover window (1) has a flexibility diameter of 10 mm, with a flexibility test performed in the first direction (MD) and the second direction (TD) simultaneously, yielding results as follows: the second direction (TD) can sustain at least 50,000 instances of tensile stress change without causing abnormality to the coating layer (11), but the first direction (MD) can only sustain maximum 5,000 instances of tensile stress change before the coating layer (11) cracks.

When the cover window (1) of the present invention is adapted for use with a touch device (2), the second direction (TD) must equal the flexibility direction of the touch device (2) to prevent the coating layer (11) from cracking. According to the present invention, the cover window (1) has a flexibility diameter (Φ) of 10 mm, and the coating layer (11) has a rigidity of 3 H (equivalent to 750 g under JIS-5600), thereby striking a balance between flexibility feature and surface rigidity. Furthermore, light rays which pass through an object capable of birefringence usually end up with deviation of the penetrating rays because of a difference in transmittance between different wavelengths; the larger the Re (in-plane retardation) is, the denser are the peaks and troughs, and the lesser is the transmittance resolution at different wavelengths, thereby subduing rainbow patterns. Since the substrate has a Re (in-plane retardation) of 6000 to 12000 nm, a penetrating ray of an incident ray is uniformly distributed on a visible region of the cover window, so as to reduce the phase difference between reflected rays, reduce rainbow patterns, and enhance visibility under a polarizer. In addition, the aforesaid structures cannot be easily conceived and accomplished by persons skilled in the art, and thus the aforesaid structures have novelty and non-obviousness.

The above detailed description fully shows that the objectives and advantages of the present invention are non-obvious, have high industrial applicability, and shows that the present invention is novel. Therefore, the present invention meets patentability requirements. The present invention is disclosed above by preferred embodiments. However, persons skilled in the art should understand that the preferred embodiments are illustrative of the present invention only, but should not be interpreted as restrictive of the scope of the present invention. Hence, all equivalent changes and modifications to the aforesaid embodiments should fall within the scope of the present invention. Accordingly, the legal protection for the present invention should be defined by the appended claims.

What is claimed is:

1. A cover window, applicable to a touch device, with a flexibility line centrally defined on the touch device, the cover window comprising:
   a substrate with a thickness of 60 to 120 μm and a Re (in-plane retardation) of 6000 to 12000 nm; and
   a coating layer coated on the substrate,
   wherein
   the cover window has a first direction and a second direction, the first direction is a machine direction of the cover window and parallel to the flexibility line, and the second direction is perpendicular to the first direction;
   a tensile stress of 50 to 130 MPa is exerted on the cover window in the first direction, and a tensile stress of 140 to 300 MPa is exerted on the cover window in the second direction, a penetrating ray of an incident ray is distributed over a visible region of the cover window.

2. The cover window of claim 1, wherein the coating layer has a rigidity of 3 H which is equivalent to 750 g under JIS-5600.

3. The cover window of claim 2, wherein a tensile stress of 120 MPa is exerted on the cover window in the first direction.

4. The cover window of claim 2, wherein a tensile stress of 300 MPa is exerted on the cover window in the second direction.

5. The cover window of claim 2, wherein the substrate has a Re no less than 8000 nm.

6. The cover window of claim 1, wherein a tensile stress of 120 MPa is exerted on the cover window in the first direction.

7. The cover window of claim 6, wherein a tensile stress of 300 MPa is exerted on the cover window in the second direction.

8. The cover window of claim 7, wherein the substrate is made of one of polyimide, polyethylene terephthalate, and polyethylene naphthalate.

9. The cover window of claim 6, wherein the substrate has a Re no less than 8000 nm.

10. The cover window of claim 1, wherein a tensile stress of 300 MPa is exerted on the cover window in the second direction.

11. The cover window of claim 1, wherein the substrate has a Re no less than 8000 nm.

* * * * *